United States Patent
Kang et al.

(10) Patent No.: US 6,724,054 B1
(45) Date of Patent: Apr. 20, 2004

(54) SELF-ALIGNED CONTACT FORMATION USING DOUBLE SIN SPACERS

(75) Inventors: Woo-tag Kang, Apex, NC (US);
Rajeev Malik, Pleasantville, NY (US);
Mihel Seitz, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/320,867

(22) Filed: Dec. 17, 2002

(51) Int. Cl.[7] .............................................. H01L 31/119
(52) U.S. Cl. ....................... 257/407; 257/346; 257/387; 438/229; 438/230; 438/233
(58) Field of Search ................................ 257/773, 365, 257/412, 623, 295, 310, 407, 409, 346, 387; 438/230, 297, 592, 593, 229–233

(56) References Cited

U.S. PATENT DOCUMENTS

| | | |
|---|---|---|
| 5,953,614 A * | 9/1999 | Liu et al. ..................... 438/303 |
| 5,998,290 A | 12/1999 | Wu et al. |
| 6,159,835 A | 12/2000 | Visokay et al. |
| 6,198,144 B1 | 3/2001 | Pan et al. |
| 6,235,621 B1 | 5/2001 | Jeng et al. |
| 6,281,539 B1 | 8/2001 | Mandelman et al. |
| 6,284,593 B1 | 9/2001 | Mandelman et al. |
| 6,465,294 B1 | 10/2002 | Tsai et al. |

* cited by examiner

*Primary Examiner*—Roy Potter
(74) *Attorney, Agent, or Firm*—Thomas R. FitzGerald, Esq.

(57) ABSTRACT

A method for fabricating a self-aligned contact in an integrated circuit includes defining first spacer layers over the sidewalls of a pair of wordline stacks. An oxide layer is deposited over the tops of the wordline stacks, the first spacer layers and a surface of the substrate disposed between the first spacer layers. The oxide layer is removed from the first spacer layers, thereby forming a remaining oxide layer that covers the surface of the substrate disposed between the first spacer layers. Second spacer layers are formed over the first spacer layers, and which cover respective portions of the remaining oxide layer. The remaining oxide layer is removed to thereby form undercut regions. The undercut regions are substantially filled with contact material during formation of the contact.

14 Claims, 5 Drawing Sheets

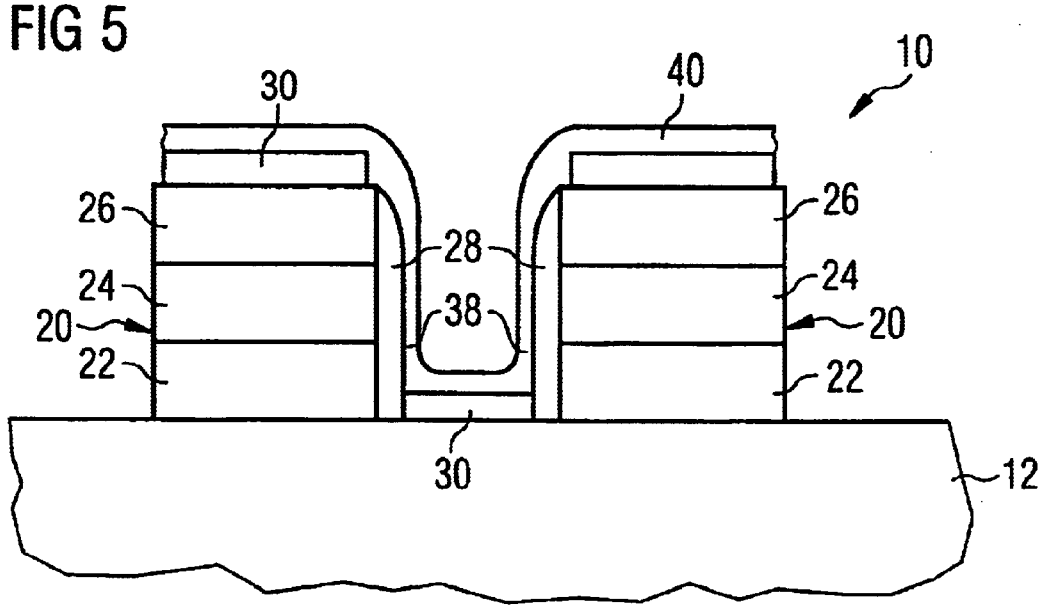
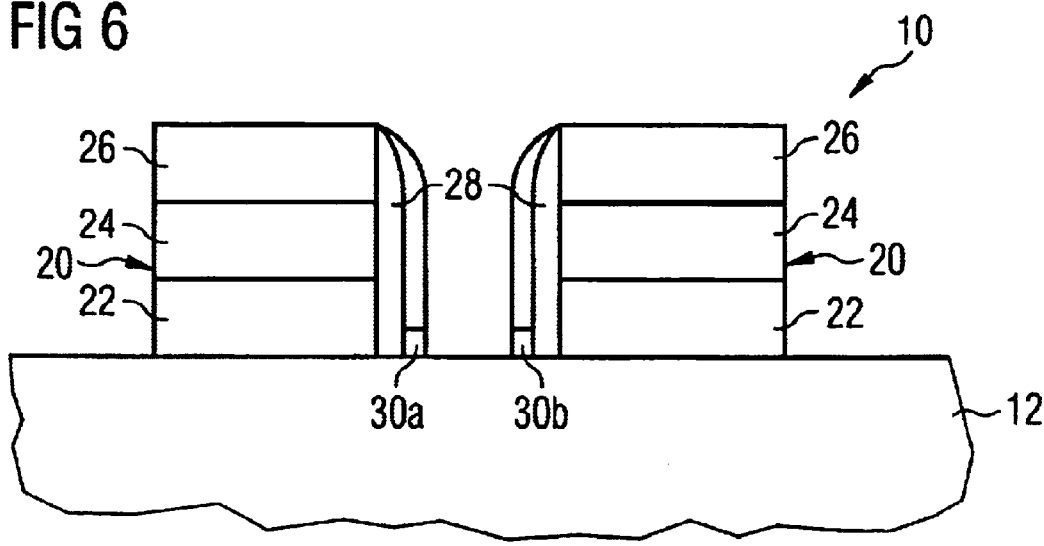

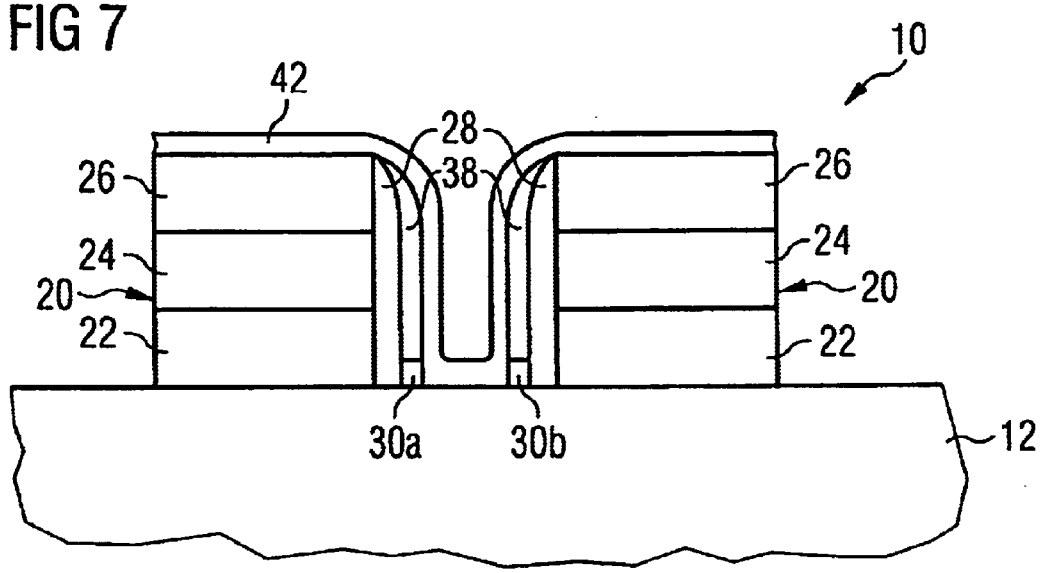
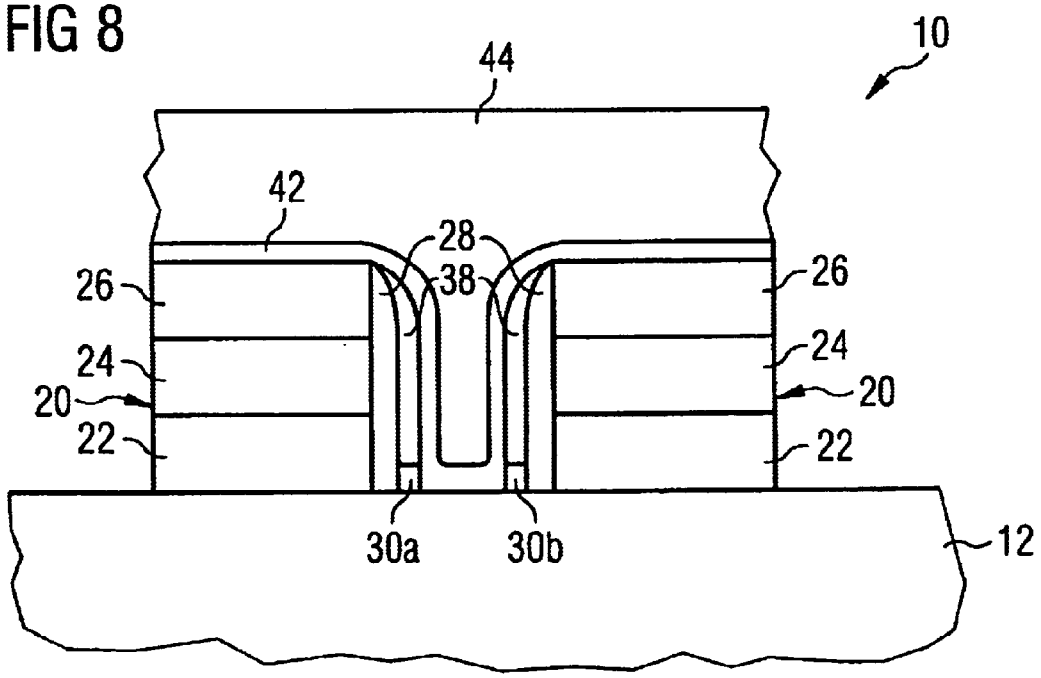

SELF-ALIGNED CONTACT FORMATION USING DOUBLE SIN SPACERS

FIELD OF THE INVENTION

The present invention relates generally to integrated circuits, and more particularly to an integrated circuit having an improved self-aligned contact structure and a method of fabricating same.

DESCRIPTION OF THE RELATED ART

Integrated circuits (ICs) or chips require contacts or contact regions that are fabricated from an electrically-conductive material, such as, for example, a metal or alloy. The contacts enable current to flow between one part of the circuit, such as a drain or source region, and another part of the circuit and/or the outside world. A contact desirably has a relatively low electrical resistance.

The consumer desire for miniature, portable and, integrated electronic devices has forced designers to continually seek to increase the density and reduce the size of ICs, and to integrate multiple functions into a single IC. Accordingly, designers seek to reduce the size of or shrink the individual features within an IC, including the contact regions. However, as the size (i.e., the area) of a contact region decreases its resistivity undesirably increases.

In order to form contacts in such dense ICs, a process that uses the topography of the IC itself, rather than masking or photoresist processes, is used. Such a process is referred to as a self-aligned contact formation process. In the self-aligned contact formation process, spacers formed of an insulative material, such as, for example, silicon nitride, are deposited on the sidewalls of a gate electrode stack or wordlines. The spacers insulate the gate electrode from the conductive layer that is subsequently deposited to form the contact. The thickness of these spacers is a critical characteristic. A spacer having a less than desired thickness may not adequately insulate the gate from the contact, whereas a spacer having a greater than desired thickness reduces the available area for the contact, thereby undesirably increasing the resistance of the contact.

Typically, the thickness of a spacer is greatest proximate the surface of the silicon wafer, and is smallest at the upper corners of the gate electrode structure (i.e., furthest from the surface of the silicon wafer). The thickness of the spacers at the upper corners of the gate electrode structure must be maintained at a minimum in order to prevent the gate electrode from shorting to the contact. However, maintaining the thickness of the spacers at the upper corners of the gate electrode results in a spacer that is thicker than necessary proximate to the surface of the silicon wafer. The increased thickness proximate the silicon surface consumes area that could otherwise be occupied by the contact, and thereby decreases the area available for the contact. Thus, the resistance of the contact is undesirably increased.

Therefore, what is needed in the art is an integrated circuit with spacers having a desired thickness proximate the upper corner of the gate electrode and having a reduced thickness proximate the silicon surface, and a method of fabricating same.

Furthermore what is needed in the art is an integrated circuit with increased contact area (and thus reduced contact resistance) and yet with sufficient insulation at the upper corners of the gate electrode, and a method of fabricating same.

SUMMARY OF THE INVENTION

The present invention provides a method for fabricating a self-aligned contact having reduced contact resistance in an integrated circuit.

The invention comprises, in one form thereof, a method that includes defining first spacer layers over the sidewalls of a pair of wordline stacks. An oxide layer is deposited over the tops of the wordline stacks, the first spacer layers and a surface of the substrate disposed between the first spacer layers. The oxide layer is removed from the first spacer layers, thereby forming a remaining oxide layer that covers the surface of the substrate disposed between the first spacer layers. Second spacer layers are formed over the first spacer layers, and cover respective portions of the remaining oxide layer. The remaining oxide layer is removed to thereby form undercut regions. The undercut regions are substantially filled with contact material during formation of the contact.

An advantage of the present invention is that the contact area is increased, and the resistance of the contact is reduced, relative to conventional contacts.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein:

FIGS. 1–10 are cross-sectional views of one embodiment of an integrated circuit of the present invention, each illustrating a specific step in one embodiment of a method of the present invention.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
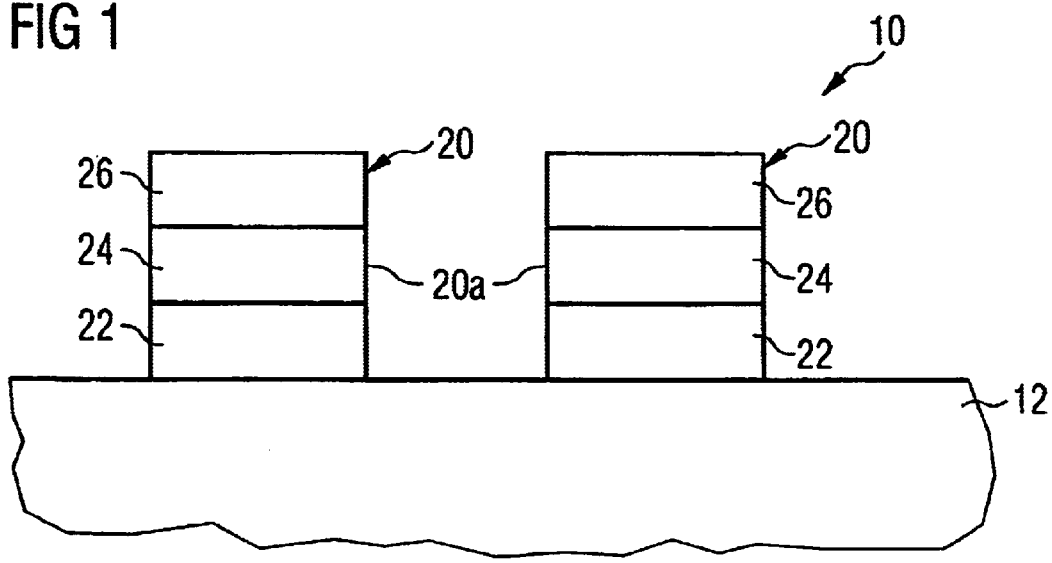

Referring now to the drawings, and particularly to FIG. 1, there is shown a partially fabricated or initial structure of one embodiment of an integrated circuit of the present invention. Integrated circuit (IC) 10, such as, for example, a dynamic random access memory (DRAM) circuit, is formed on substrate 12, and includes gate or wordline stacks 20 that have been fabricated using conventional processes and techniques.

More particularly, the exemplary embodiment of IC 10 includes gate or wordline stacks 20 having respective polysilicon layers 22 deposited, such as, for example, by low pressure chemical vapor deposition (LPCVD), onto substrate 12 with a typical thickness of from approximately 200 to approximately 1500 Angstroms (Å). Gate stacks 20 further include wordline layer 24 that is typically a layer of tungsten silicide (WSi) or tungsten plus tungsten nitride (W/WN) deposited onto polysilicon layer 22, such as, for example, by chemical vapor deposition or sputtering, and having a typical thickness of from approximately 200 to approximately 1500 Å. Cap layer 26 is disposed over wordline layer 24, and is typically a layer of silicon nitride (SiN) deposited by, for example, LPCVD and having a typical thickness of from approximately 1000 to 2500 Å. Gate stacks 20 are thus formed, each including a respective inner sidewall 20a.

The foregoing description of IC 10 details only the structures of IC 10 that are relevant to and which are necessary for a further description of the present invention, and therefore is not intended to encompass other aspects of the fabrication of IC 10, such as, for example, fabrication of the capacitor element which can be performed before or after formation of gate stacks 20.

Figure 2:
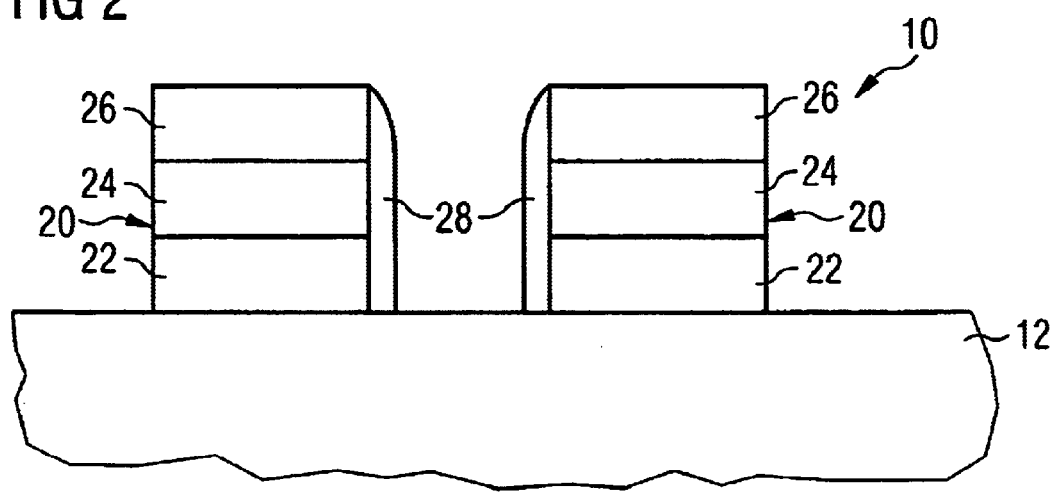

Referring now to FIG. 2, it is seen that a first insulating layer, such as, for example, a layer of SiN, has been deposited and etched such that first spacer layers 28 are formed. More particularly, the first insulating or SiN layer is deposited, such as, for example, by LPCVD to a typical thickness of from approximately 100 to approximately 300 Å. This layer is then etched to remove the material from all but the inner sidewalls 20a of gate stacks 20, thereby defining first spacer layers 28 that are disposed on the inner sidewalls 20a of gate stacks 20 and which extend from substrate 12 to the top of gate stacks 20. First spacer layers 28 each cover a corresponding portion of substrate 12 that is equal to their respective thickness at the surface of substrate 12. First spacer layers 28 do not, however, cover the portion of substrate 12 that is disposed between gate stacks 20 and at a distance from a corresponding gate stack 20 that exceeds the thickness of first spacer layers 28. In other words, first spacer layers 28 cover only a relatively small portion of the surface of substrate 12 disposed between gate stacks 20.

It should be particularly noted that, although not shown in the Figures, corresponding and substantially similar spacers are also formed over the outer sidewalls of gate stacks 20.

Figure 3:
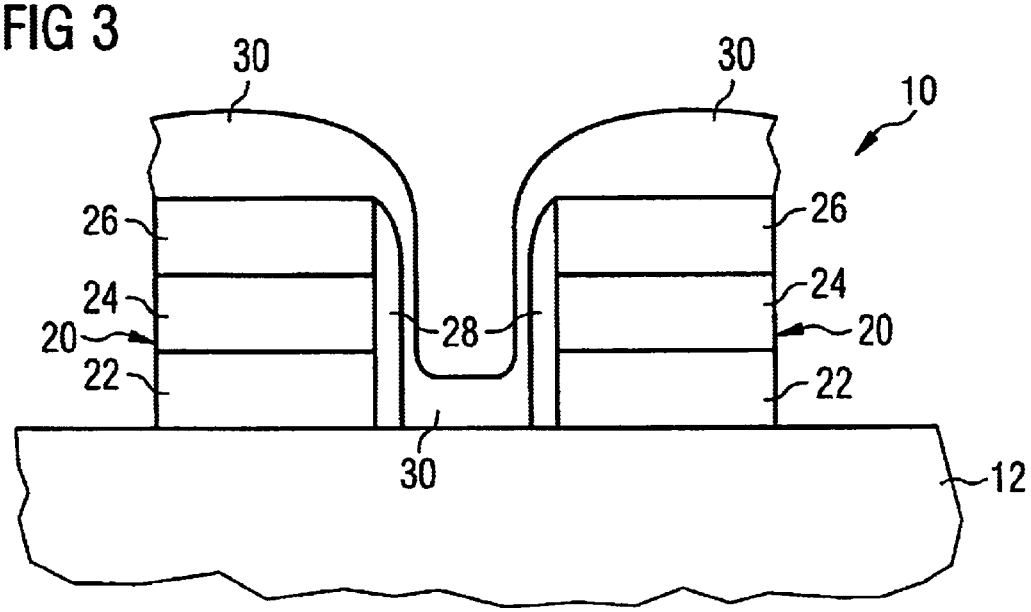
Figure 4:
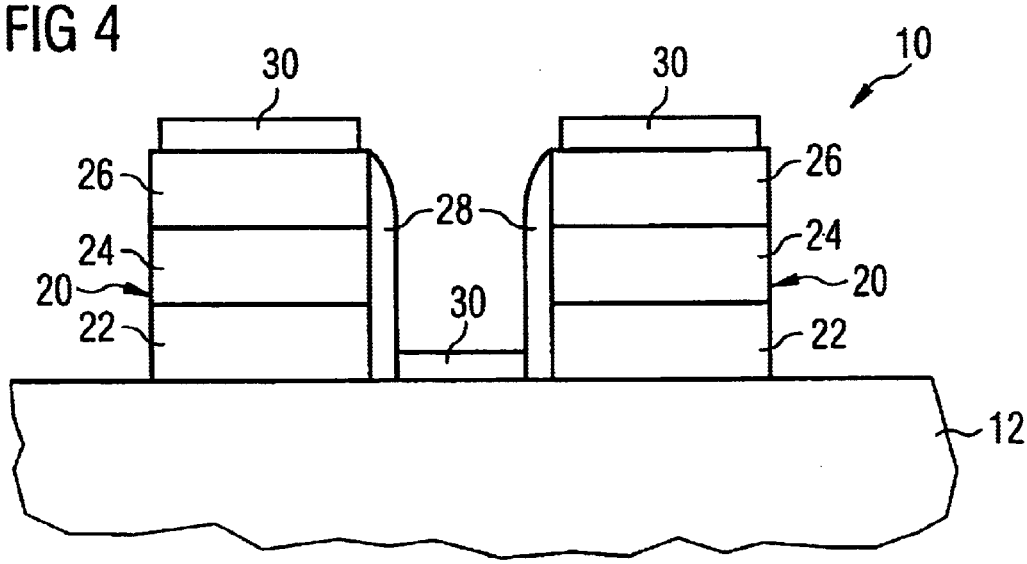

As shown in FIG. 3, a layer of oxide 30 is deposited over and between gate structures 20, and over first spacer layers 28. Oxide layer 30 is deposited using a technique, such as, for example, a high-density plasma deposition technique, that creates a non-uniform deposition of oxide layer 30. More particularly, oxide layer 30 is deposited such that it is thinner in the area overlying first spacer layers 28 and thicker virtually everywhere else. Oxide layer 30 has a typical thickness of from approximately 200 to approximately 1000 Å, preferably between 200 to approximately 600 Å. As shown in FIG. 4, oxide layer 30 is etched back, such as, for example, through a hydrogen-fluoride chemical etch, to remove residual oxide from over inner sidewalls 20a of gate stacks 20 and/or form first spacer layers 28. It should be noted that after the etching back, oxide layer 30 remains disposed upon and/or over a substantial portion of cap layer 26 of gate stack 20 and the portion of substrate 12 disposed between first spacer layers 28 of gate stacks 20, albeit with a somewhat reduced thickness.

Following the etch back of oxide layer 30, a second insulating layer 34, such as, for example, SiN, is deposited over and between gate stacks 20. More particularly, and as best shown in FIG. 5, second insulating or SiN layer 34 is deposited, such as, for example, by LPCVD to a typical thickness of from approximately 100 to approximately 300 Å. Second SiN layer 34, as best shown in FIG. 6, is then removed, such as, for example, via a standard nitride etch, from all but the first spacer layers 28 of gate stacks 20, thereby defining second spacer layers 38 that are disposed over and/or upon first spacer layers 28. A reactive ion etch (RIE) is then performed that leaves portions 30a and 30b of oxide layer 30 that lie "underneath" second SiN spacers 38, and which are disposed between second spacer layers 38 and substrate 12, undisturbed yet removes the portions of second SiN layer 34 and oxide layer 30 that were disposed upon substrate 12 in the area between second SiN spacer layers 38. In the interest of clarity, portions 30a and 30b of oxide layer 30 are hereinafter referred to as oxide spacers 30a and 30b.

A liner layer 42, such as, for example, SiN, is then deposited, such as, for example, by LPCVD, over the structure thus far depicted and described, as shown in FIG. 7. SiN liner layer 42 has a thickness of from approximately 100 to approximately 300 Å. Over SiN layer 42 is deposited., such as, for example, by chemical vapor deposition, a layer of Boron/Phosphorous doped silicate glass (BPSG) 44 having a thickness of from approximately 2,000 to approximately 10,000 Å, as shown in FIG. 8. An anneal is performed to densify BPSG layer 44, and a chemical/mechanical planarization is performed to planarize the surface of BPSG layer 44. Conventional processing is then performed to prepare IC 10 for contact etching.

Figure 9:
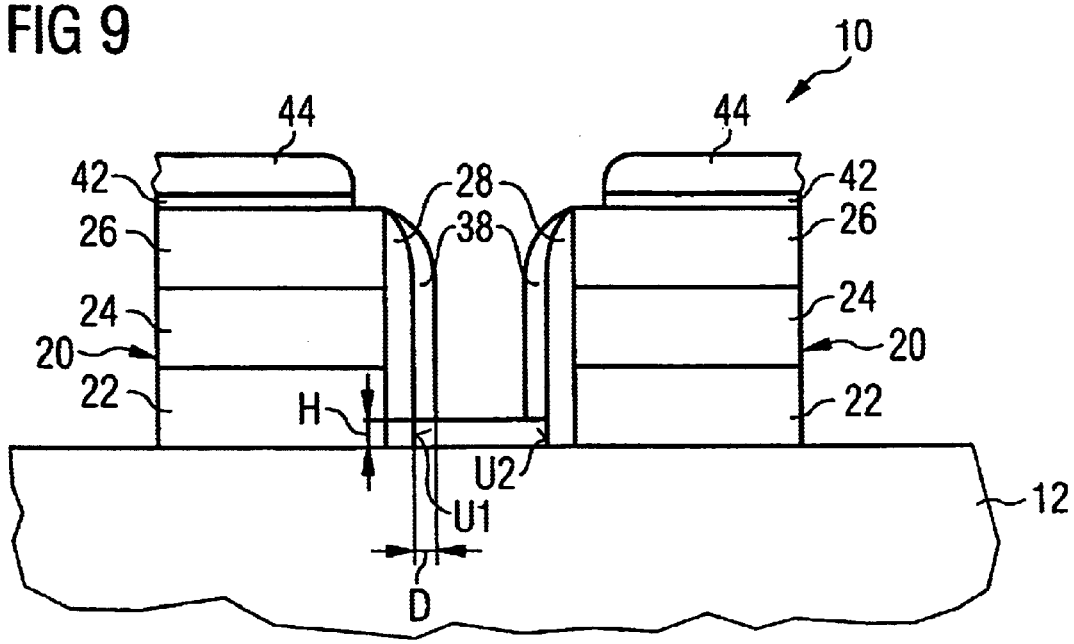

Thereafter, a bit line contact etch is performed. As shown in FIG. 9, SiN liner layer 42 and BPSG layer 44 are etched by a self-aligned contact etch, i.e., an oxide etch selective to SiN. Following the SiN-selective etch, a short wet oxide etch, such as, for example, a hydrogen-fluoride chemical etch, is performed to ensure that oxide spacers 30a and 30b under second SiN spacer layers 38 are removed. The structure of IC 10 following this wet etch is shown in FIG. 9.

It should be particularly noted that the removal of oxide spacers 30a and 30b leaves undercut regions U1 and U2. Undercut regions U1 and U2 have a height H of from approximately 200 to approximately 1000 Å, and preferably between 200 to approximately 600 Å. Thus, the bottoms of second SiN spacer layers 38, i.e., the portions thereof that are proximate substrate 12, are spaced from substrate 12 by that same height, i.e., a distance of 200 to approximately 1000 Å, and preferably between 200 to approximately 600 Å. This is due to the fact that undercut regions are formed by the removal of oxide layer 30, which has a thickness of from approximately 200 to approximately 1000 Å, and preferably between 200 to approximately 600 Å. Similarly, undercut regions have a depth D of from approximately 100 to approximately 300 Å, or approximately the same as the thickness of second spacer layer 38.

Figure 10:
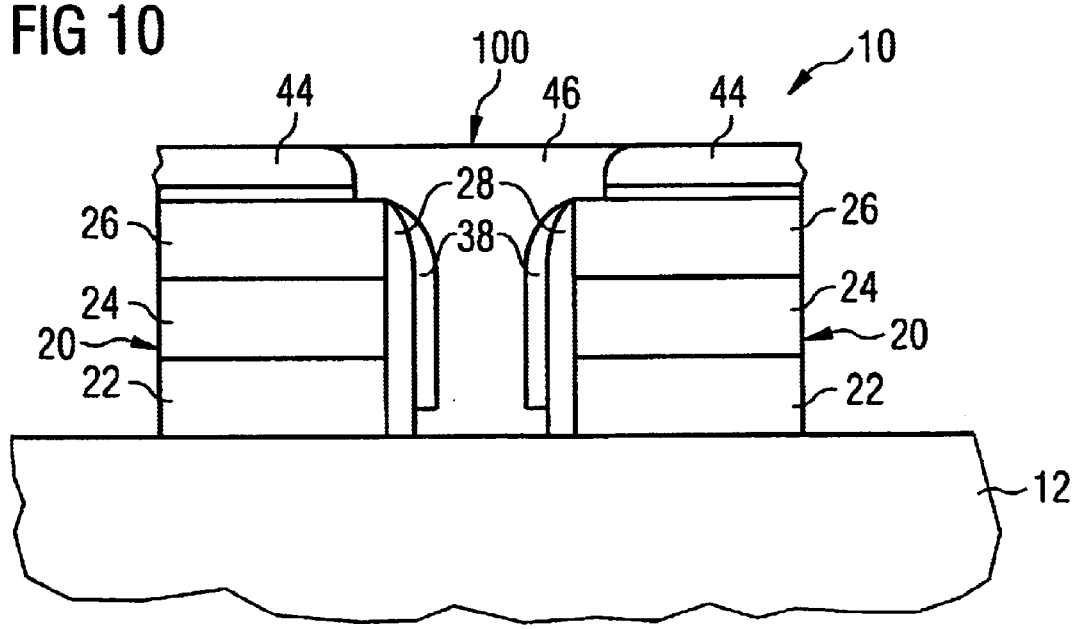

The bitline contact material 46 is then deposited, as shown in FIG. 10. More particularly, bitline contact material 46, such as, for example, polysilicon or tungsten, is deposited using chemical vapor deposition (CVD) so that the relatively small undercut regions U1 and U2, i.e., the undercut regions that remain after the wet etch removal of oxide spacers 30a and 30b, are adequately filled with bitline contact material 46. Filling in the undercut regions U1 and U2 contributes to a reduction in the overall contact resistance of the completed self aligned contact, generally designated 100 in FIG. 10.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A self-aligned contact structure in an integrated circuit, the integrated circuit having a substrate and at least one wordline stack formed thereon, the wordline stack having sidewalls, said self-aligned contact structure comprising:

a first spacer layer of insulative material disposed upon said sidewalls and overlying a portion of the substrate;

a second spacer layer of insulative material disposed upon said first spacer layer and over said sidewalls, said second spacer layer being spaced a predetermined distance from said substrate, undercut regions defined by said first and second spacer layers and the substrate; and contact material disposed upon the substrate and said second spacer layers, said contact material substantially completely filling in said undercut regions.

2. The self-aligned contact structure of claim 1, wherein said first and second spacer layers comprise silicon nitride.

3. The self-aligned contact structure of claim 2, wherein said first and second spacer layers have an average thickness of from approximately 200 to approximately 1000 Angstroms ($\Delta$).

4. The self-aligned contact structure of claim 3, wherein said first and second spacer layers have an average thickness of from approximately 200 to approximately 600 Angstroms ($\Delta$).

5. The self-aligned contact structure of claim 1, wherein said contact material comprises polysilicon.

6. The self-aligned contact structure of claim 1, wherein said undercut regions have a height of from approximately 200 to approximately 1000 Angstroms ($\Delta$).

7. The self-aligned contact structure of claim 1, wherein said undercut regions have a height of from approximately 200 to approximately 1000 Angstroms ($\Delta$), and a depth of from approximately 100 to approximately 300 $\Delta$.

8. An integrated circuit having a substrate, said integrated circuit comprising:

first and second wordline stacks disposed upon said substrate, said wordline stacks having respective sidewalls;

a first spacer layer of insulative material disposed upon said sidewalls and overlying a portion of said substrate;

a second spacer layer of insulative material disposed upon said first spacer layer and over said sidewalls, said second spacer layer being spaced a predetermined distance from said substrate, undercut regions defined by said first and second spacer layers and said substrate; and contact material disposed upon said substrate and said second spacer layers, said contact material substantially completely filling in said undercut regions.

9. The self-aligned contact structure of claim 8, wherein said first and second spacer layers comprise silicon nitride.

10. The self-aligned contact structure of claim 9, wherein said first and second spacer layers have an average thickness of from approximately 200 to approximately 1000 Angstroms ($\Delta$).

11. The self-aligned contact structure of claim 10, wherein said first and second spacer layers have an average thickness of from approximately 200 to approximately 600 Angstroms ($\Delta$).

12. The self-aligned contact structure of claim 8, wherein said contact material comprises polysilicon.

13. The self-aligned contact structure of claim 8, wherein said undercut regions have a height of from approximately 200 to approximately 1000 Angstroms ($\Delta$).

14. The self-aligned contact structure of claim 8, wherein said undercut regions have a height of from approximately 200 to approximately 1000 Angstroms ($\Delta$), and a depth of from approximately 100 to approximately 300 $\Delta$.

* * * * *